United States Patent

[15] 3,644,853

[45] Feb. 22, 1972

Ma

[54] VOLTAGE-CONTROLLED SIGNAL-SEEKING TUNING SYSTEM

[72] Inventor: John Y. Ma, Glenview, Ill.

[73] Assignee: Zenith Radio Corporation, Chicago, Ill.

[22] Filed: Nov. 23, 1970

[21] Appl. No.: 91,894

[52] U.S. Cl. ....................................334/15, 325/470, 334/16

[51] Int. Cl. ..........................................H03j 3/18, H04b 1/32

[58] Field of Search ........................................334/11, 14–16; 333/17; 325/469, 470

[56] References Cited

UNITED STATES PATENTS 2,977,467 3/1961 Black ....................................334/11 X 3,384,826 5/1968 Schurig ....................................334/15 X 3,519,939 7/1970 Tashima ....................................334/15 X

*Primary Examiner*—Herman Karl Saalbach

*Assistant Examiner*—Paul L. Gensler

*Attorney*—John J. Pederson and R. A. Blackstone

[57] ABSTRACT

A signal-seeking tuning system for a receiver having a voltage-controlled tuner wherein a switching circuit, a low-leakage storage capacitor, and a metal oxide field-effect transistor are provided for applying a DC control voltage to the tuner and maintaining the applied voltage at the value corresponding to the selected signal so that the receiver remains tuned to the selected frequency irrespective of temporary loss of signal or receiver deenergization.

3 Claims, 1 Drawing Figure

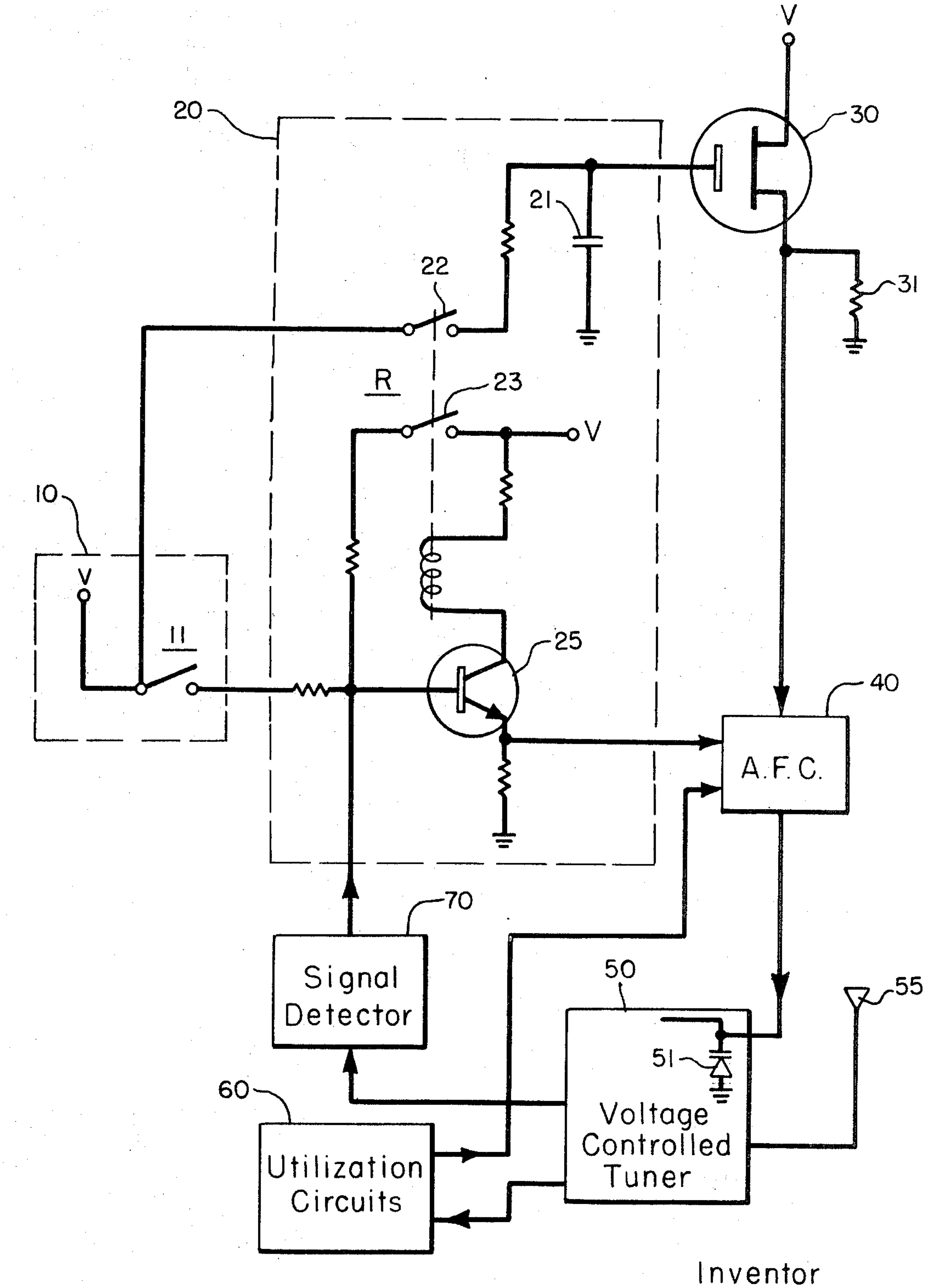
Inventor
John Y. Ma
By R.A. Blackstone
Agent

VOLTAGE-CONTROLLED SIGNAL-SEEKING TUNING SYSTEM

BACKGROUND OF THE INVENTION

Signal-seeking tuning systems are well known for their convenience and ease of operation, especially in the field of radio and television receivers. They are commonly used to provide automatic tuning to the next higher or lower frequency of interest in response to a user-operated initiating mechanism (typically a momentary-contact switch). The advent of solid-state, voltage-dependent variable-reactance devices has permitted substantial improvement in signal-seeking tuning systems because of the consequent elimination of electric motors and other moving parts, thereby increasing efficiency and decreasing the number of malfunctions resulting from mechanical wear, dirt accumulation, and contact corrosion.

The most common type of voltage-dependent variable-reactance device is a diode which has an interelectrode capacitance directly proportional to its reverse-bias voltage, commonly referred to as a "Varicap" or "varactor" diode. By placing one or more such diodes in the frequency-selecting portion of a tuner, station selection may be achieved by progressively increasing or decreasing the voltage applied to the diode(s) until the desired frequency is obtained. Moreover, by combining a varactor-diode tuner with a progressively variable DC control voltage generator, a signal detector, and a feedback control loop, a satisfactory solid-state signal-seeking system may be created.

In conventional signal-seeking systems employing varactor diodes, however, a temporary loss of signal resulting from "airplane flutter," transmitter failure, etc., or even receiver deenergization, varies (or eliminates) the control voltage and/or interrupts the recognition signal from the signal detector and therefore sends the system seeking for a new station. The addition of complex delay circuitry for temporarily maintaining the DC control voltage not only adds appreciable cost to the system but also does not compensate for the loss of control voltage due to receiver deenergization such as when the receiver is turned off for a while.

It is therefore an object of the invention to provide a new and improved signal-seeking system for a voltage-controlled tuner.

It is a more specific object of the invention to provide such a new and improved signal-seeking tuning system which is immune to undesired signal-seeking resulting from a temporary loss of signal or receiver deenergization.

SUMMARY OF THE INVENTION

The invention relates to a signal-seeking tuning system for a voltage-controlled tuner having at least one voltage-dependent variable-reactance element to which a progressively variable DC control voltage is applied. In accordance with the invention, improved means for maintaining the tuner at the frequency of a selected signal comprise means for initiating the signal-seeking operation and a signal detector coupled to the tuner and responsive to a received signal for developing a recognition signal. An energy-storage device and switch means coupled between the initiating means and the device and responsive to the recognition signal are provided for decoupling the storage device from the initiating means. Also provided are means, including the switch means and storage device, responsive to the initiating means for generating a progressively variable DC control voltage. Means including a transistor coupled between the storage device and the tuner are further provided for applying to the variable-reactance element a voltage corresponding to the control voltage.

BRIEF DESCRIPTION OF THE DRAWING

The features of the present invention which are believed to be novel are set forth with particularity in the appended claims. The invention, together with further objects and advantages thereof, may best be understood by reference to the following description taken in connection with the accompanying drawing, the single FIGURE of which is a schematic diagram of a preferred embodiment of the invention.

DESCRIPTION OF THE PREFERRED EMBODIMENT

With reference to the FIGURE, there is shown in schematic diagram form a preferred embodiment of a signal-seeking tuning system for a voltage-controlled tuner 50 having at least one voltage-dependent variable-reactance element 51 to which a progressively-variable DC control voltage is applied. Tuner 50 may be that of a radio, television, or any other kind of tunable receiver. Improved means for maintaining tuner 50 at the frequency of selected signal comprise means 10 for initiating the signal-seeking operation and a signal detector 70 coupled to tuner 50. Initiating means 10 are provided here in the form of a momentary-contact switch 11 which is operable to connect a suitable energy source V to voltage generator 20 to begin the signal-seeking operation. By providing a single energy source in the form of voltage V and a single-pole, single-throw switch 11, unidirectional signal seeking is initiated. Of course, where bidirectional signal seeking is desired, an additional, opposite-polarity energy source with an appropriate switch (not shown) may be provided for that purpose. A particularly advantageous bidirectional initiating means is shown and described in copending application Ser. No. 68,081, filed Aug. 31, 1970, in the name of Fredrick Zlotnick, and assigned to the same assignee as the present invention.

Utilization circuit 60 exemplifies the remaining receiver circuitry for a radio, television, etc., and is shown symbolically here because it forms no essential part of the invention. Signal detector 70 is responsive to a received signal for developing a recognition signal. A particularly advantageous signal detector is also shown and described in the above-mentioned copending application.

In accordance with the invention, an energy-storage device is provided in the form of a capacitor 21 which has a low leakage characteristic. Capacitors having a polyester (e.g., Mylar) dielectric have been found well suited for this application. Switch means in the form of a double-pole, single-throw relay R is coupled between initiating means 10 and capacitor 21 and is responsive to a recognition signal from signal detector 70 for decoupling capacitor 21 from initiating means 10. A relay driver transistor 25 operates relay R in response to a signal from initiating means 10. Means 20, including relay R and capacitor 21, is responsive to initiating means 10 for generating a progressively variable DC control voltage. Upon the momentary closing of switch 11, voltage V is applied to the base of transistor 25 to thereby energize relay R and move contact-armatures 22 and 23 to the closed position. Closing contact-armature 23 maintains a sufficient voltage on the base of transistor 25 to keep it turned on after momentary-contact switch 11 is released. Closing contact-armature 22 begins the charging (or discharging, as the case may be) of capacitor 21 to thereby generate a progressively variable DC control voltage. This control voltage is continuously generated until signal detector 70 applies a recognition signal to the base of transistor 25, whereupon transistor 25 is turned off, thereby deenergizing relay R and opening contact-armatures 22 and 23.

Further in accordance with the invention, means including transistor 30 coupled between capacitor 21 and tuner 50 are provided for applying to variable-reactance element 51 a voltage corresponding to the control voltage. Transistor 30 preferably has a very high base-emitter input impedance so that it doesn't degrade the low-leakage characteristic of capacitor 21. A metal oxide field-effect transistor (MOSFET) has been found particularly advantageous for this application because its base-emitter input impedance is on the order of $10^{14}$ ohms, even when it is deenergized (i.e., when no bias voltage is applied to the device). This latter characteristic, when combined with a low-leakage polyester-dielectric capacitor and a switching device such as relay R, provides means for maintaining the DC control voltage at its selected level while the receiver is deenergized so that, when the receiver is later energized, the tuner remains tuned to the same frequency as it was before deenergization. Moreover, the circuit of the invention maintains the DC control voltage at its selected value while the receiver is energized regardless of a temporary loss of signal due to "airplane flutter," transmitter failure, etc. The invention achieves these results by eliminating all control voltage leakage paths; that is, the energy-storage device comprises a low-leakage polyester (e.g., Mylar) capacitor 21 having an input circuit which is open except during the signal-seeking operation and an output circuit which has an impedance so high that, for practical purposes, it may be considered an open circuit.

In addition to having an ultrahigh-impedance input, to prevent leakage, it is important for the control-voltage to be applied to the tuner by a device having a relatively low impedance in order to properly "drive" the tuner. With an output impedance in the order of $10^4$ ohms, the MOSFET is therefore doubly well suited for this application. The low "-driving" impedance substantially eliminates stray AC signal pickup, and therefore the usual filter capacitor, which creates an undesirable time delay and prevents control-voltage variation due to reverse current in the transistor, can be omitted. It should be noted that, although a MOSFET has been found to be well suited for this application, a junction field-effect transistor (JFET) or a Darlington pair may be substituted therefor in applications where the coupling device is not subject to recurrent deenergization.

A voltage corresponding to the control voltage is developed across a resistor 31 which is coupled between the drain electrode of transistor 30 and ground. This voltage is applied to varactor diode 51 in tuner 50 by means of a conventional automatic frequency control (AFC) circuit 40. Although it is not necessary for the operation of the invention, AFC circuit 40 may be desirable in some embodiments for "locking in" the tuner to the frequency of the received RF signal and thereby permitting the omission of the usual fine-tuning mechanism. An AFC-defeat signal may be obtained from the emitter of transistor 25 in order to disable AFC circuit 40 during the signal-seeking operation.

Thus the invention provides a new and improved signal-seeking system for a voltage-controlled tuner wherein control voltage maintenance is established by the combination of a low-leakage energy-storage device, an ultrahigh-impedance coupling transistor, and the complete energy-storage circuit isolation provided by relay R. The tuner is maintained at the selected frequency regardless of temporary loss of signals such as that occasioned by "airplane flutter," transmitter failure, etc. The receiver may even be turned on after being off for a period of several days and still be tuned to the same frequency as before.

While a particular embodiment of the invention has been shown and described, it will be obvious to those skilled in the art that changes and modifications may be made without departing from the invention in its broader aspects, and therefore, the aim in the appended claims is to cover all such changes and modifications as fall within the true spirit and scope of the invention.

I claim:

1. In a signal-seeking tuning system for a voltage-controlled tuner having at least one voltage-dependent variable-reactance element to which a progressively variable DC control voltage is applied, improved means for maintaining the tuner at the frequency of a selected signal, comprising:

means for initiating the signal-seeking operation;

a signal detector coupled to said tuner and responsive to a received signal for developing a recognition signal;

an energy-storage device;

switch means coupled between said initiating means and said device and responsive to said recognition signal for decoupling said storage device from said initiating means;

means, including said switch means and said storage device, responsive to said initiating means for generating a progressively variable DC control voltage;

and means including a transistor coupled between said storage device and said tuner for applying to said variable-reactance element a voltage corresponding to said control voltage.

2. A system according to claim 1, in which said transistor is a metal oxide field effect transistor and said energy-storing device is a polyester-dielectric capacitor.

3. A system according to claim 1, which further comprises an automatic frequency control (AFC) circuit coupled between said transistor and said tuner for locking in the tuner to the frequency of the selected signal, thereby permitting the omission of the usual fine-tuning means.

* * * * *